US007945415B2

(12) United States Patent
Perryman

(10) Patent No.: US 7,945,415 B2
(45) Date of Patent: May 17, 2011

(54) DETECTION OF FAULTS IN AN INJECTOR ARRANGEMENT

(75) Inventor: Louisa J. Perryman, Rainham (GB)

(73) Assignee: Delphi Technologies Holding S.arl, Troy, MI (US)

( * ) Notice: Subject to any disclaimer, the term of this patent is extended or adjusted under 35 U.S.C. 154(b) by 301 days.

(21) Appl. No.: 12/157,543

(22) Filed: Jun. 11, 2008

(65) Prior Publication Data

US 2008/0319699 A1 Dec. 25, 2008

(30) Foreign Application Priority Data

Jun. 22, 2007 (EP) .................................... 07252534

(51) Int. Cl.
*G01R 31/308* (2006.01)

(52) U.S. Cl. .......... 702/115; 702/33; 701/101; 123/408; 123/406.02

(58) Field of Classification Search .................. 702/115, 702/33; 701/101-102, 115; 123/408, 406.02
See application file for complete search history.

(56) References Cited

U.S. PATENT DOCUMENTS

| | | | | |
|---|---|---|---|---|
| 5,595,215 | A * | 1/1997 | Wallace et al. | 137/554 |
| 6,487,505 | B1 * | 11/2002 | Mock et al. | 702/33 |
| 6,560,528 | B1 * | 5/2003 | Gitlin et al. | 701/115 |
| 2001/0039484 | A1 | 11/2001 | Freudenberg et al. | |
| 2004/0008032 | A1 | 1/2004 | Rueger et al. | |

FOREIGN PATENT DOCUMENTS

| | | |
|---|---|---|
| EP | 1 843 027 | 10/2007 |
| JP | 2002-246667 | 8/2002 |
| WO | 2005/028836 | 3/2005 |
| WO | 2005/106227 | 11/2005 |

OTHER PUBLICATIONS

Japan Office Action dated Dec. 2, 2010.

* cited by examiner

*Primary Examiner* — Drew A Dunn
*Assistant Examiner* — Hien X Vo
(74) *Attorney, Agent, or Firm* — Thomas N. Twomey

(57) ABSTRACT

A fault detection method for detecting short circuit faults in an injector arrangement at engine start-up. The injector arrangement comprises one or more piezoelectric fuel injectors, which are connected in a drive circuit. In one aspect of the invention, the potential at a bias point in the drive circuit is determined and compared with a predicted voltage. A short circuit fault signal is generated if the potential at the bias point is not within a predetermined tolerance voltage of the predicted voltage. In another aspect of the invention, a first charge pulse is applied to the injectors to charge the injectors. A discharge current path is provided during a delay period following the first charge pulse by closing a discharge switch. A faulty injector will discharge through the discharge current path during the delay period. A second charge pulse is applied to the injectors following the delay period. Current flow is sensed during the second charge pulse, and a short circuit warning signal is generated if the current flow during the second charge pulse exceeds a predetermined threshold current.

14 Claims, 10 Drawing Sheets

DETECTION OF FAULTS IN AN INJECTOR ARRANGEMENT

TECHNICAL FIELD

The present invention relates to a method for detecting faults in a fuel injector arrangement, and particularly to a method for detecting short circuits in a fuel injector arrangement at engine start-up.

BACKGROUND TO THE INVENTION

Automotive vehicle engines are generally equipped with fuel injectors for injecting fuel (e.g. gasoline or diesel fuel) into the individual cylinders or intake manifold of the engine. The engine fuel injectors are coupled to a fuel rail which contains high pressure fuel that is delivered by way of a fuel delivery system. In diesel engines, conventional fuel injectors typically employ a valve needle that is actuated to open and to close in order to control the amount of fluid fuel metered from the fuel rail and injected into the corresponding engine cylinder or intake manifold.

One type of fuel injector that offers precise metering of fuel is the piezoelectric fuel injector. Piezoelectric fuel injectors employ piezoelectric actuators made of a stack of piezoelectric elements arranged mechanically in series for opening and for closing an injection valve needle to meter fuel injected into the engine. Piezoelectric fuel injectors are well known for use in automotive engines.

The metering of fuel with a piezoelectric fuel injector is generally achieved by controlling the electrical voltage potential applied to the piezoelectric actuators to vary the amount of expansion and contraction of the piezoelectric elements. The voltage is applied to the actuator via positive and negative terminals on the piezoelectric stack. The amount of expansion and contraction of the piezoelectric elements varies the travel distance of a valve needle and, thus, the amount of fuel that is passed through the fuel injector. Piezoelectric fuel injectors offer the ability to meter precisely a small amount of fuel.

Typically, the fuel injectors are grouped together in banks of one or more injectors. As described in EP1400676, each bank of injectors has its own drive circuit for controlling the operation of the injectors. The drive circuit includes a power supply, such as a transformer, which steps-up the voltage generated by a power source, i.e. from 12 Volts to a higher voltage, and storage capacitors for storing charge and, thus, energy. The higher voltage is applied across the storage capacitors which are used to power the charging and discharging of the piezoelectric fuel injectors for each injection event. Drive circuits have also been developed, as described in WO 2005/028836A1, which do not require a dedicated power supply, such as a transformer.

The use of these drive circuits enables the voltage applied across the storage capacitors, and thus the piezoelectric fuel injectors, to be controlled dynamically. This is achieved by using two storage capacitors which are alternately connected to an injector bank. One of the storage capacitors is connected to the injector bank during a charge phase when a charge current flows through the injector bank to charge an injector, thereby initiating an injection event in a 'charge-to-inject' fuel injector, or terminating an injection event in a 'discharge-to-inject' fuel injector. The other storage capacitor is connected to the injector bank during a discharge phase, to discharge the injectors, thereby terminating the injection event in a charge-to-inject fuel injector, or initiating an injection event in a discharge-to-inject fuel injector. The expressions "charging the injectors" and "discharging the injectors" are used for convenience and refer to the processes of charging and discharging, respectively, the piezoelectric actuators of the fuel injectors.

A regeneration switch is used during a regeneration phase at the end of the charge phase, and before a later discharge phase, to replenish the storage capacitors.

Like any circuit, faults may occur in a drive circuit. In safety critical systems, such as diesel engine fuel injection systems, a fault in the drive circuit may lead to a failure of the injection system, which could consequentially result in a catastrophic failure of the engine. Such faults include short circuit faults and open circuit faults in the piezoelectric actuators of the fuel injectors. Three main types of short circuit fault may occur:

i) a short circuit between the terminals of the piezoelectric actuator; otherwise referred to as a 'stack terminal' short circuit;

ii) a short circuit from the positive terminal of the piezoelectric actuator to a ground potential; the positive terminal is also referred to as the 'high' terminal, and this type of short circuit is generally referred to as a 'high side to ground' short circuit; and iii) a short circuit from the negative terminal of the piezoelectric actuator to a ground potential; the negative terminal is also referred to as the 'low terminal, and this type of short circuit is generally referred to as a 'low side to ground' short circuit.

Diagnostic systems for detecting short circuit, and open circuit faults in the piezoelectric actuators are disclosed in applicant's co-pending patent applications EP 06251881.6, EP 06253619.8, and EP 06256140.2, the contents of each document being incorporated herein by reference.

However, there remains a need for a robust diagnostic system able to detect the various types of short circuit fault described above at engine start-up, that is at key-on, before the injectors are charged and before an injection event takes place.

SUMMARY OF THE INVENTION

According to a first aspect of the invention, there is provided a fault detection method for detecting faults in an injector arrangement at engine start-up, the injector arrangement comprising at least one piezoelectric fuel injector, and the method comprising:

(a) determining a bias voltage at a bias point between the injector arrangement and a known potential prior to charging the injector at engine start-up;

(b) comparing the bias voltage to a predicted voltage; and (c) generating a fault signal if the bias voltage is not within a predetermined tolerance voltage of the predicted voltage.

The fault detection method is particularly suitable for detecting high side to ground short circuits. If the bias voltage is substantially equal to the predicted bias voltage, this indicates that the or each injector is 'good', that is non-faulty. However, if one or more of the injectors has a high side to ground short circuit, then the bias voltage will be lower than the predicted bias voltage. The resistance of the short circuit affects the amount by which the bias voltage deviates from the predicted voltage, the deviation being greatest for short circuits of least resistance. The tolerance voltage can be set so that only short circuits below a predetermined resistance trigger the fault signal.

The present method is suitable for detecting high side to ground short circuit faults having a wide range of resistances, from very low resistances, of the order of milliohms (mΩ), to high resistances of the order of several hundred kiloohms (kΩ).

The injector arrangement may include multiple fuel injectors forming an injector bank. The or each injector is connected in a drive circuit which may include a charge circuit and a discharge circuit for charging and discharging the or each injector. The injector bank may be selectively connectable to the charge circuit and to the discharge circuit.

The short circuit detection method may be used in any circuit having a point that is biased to a particular voltage. As such, the method is suitable for use in a drive circuit for discharge-to-inject, or charge-to-inject type injectors. Preferably the or each injector is of the discharge-to-inject type.

The charge circuit includes a high voltage rail, the bias voltage being determined at engine start-up before a high voltage is generated on the high voltage rail and before the injector bank is connected to the charge circuit. Before a high voltage is generated on the high voltage rail, the potential on the high voltage rail is known, which allows the predicted voltage to be calculated.

The predicted voltage is the potential that would be expected at the bias point at engine start-up before the high voltage rail is generated if all the injectors on the injector bank are functioning correctly, that is without short circuits. The predicted voltage is not affected by the voltages on the piezoelectric stacks of the injectors. This is advantageous because these voltages are generally not known at engine start-up.

A resistive bias network may be used to measure the potential at the bias point. The resistive bias network may comprise a resistor or resistors of known resistance connected between the bias point and a ground potential. For example, a single resistor of high resistance may be connected between the bias point and the ground potential. Alternatively, a pair of resistors having a high combined resistance may be connected in series between the bias point and the ground potential. The potential difference across the pair of resistors can be inferred from a measurement of the potential difference across one of the pair of resistors. The resistors in the pair may each have an individual resistance lower than the resistance of an aforesaid single resistor, and hence lower specification components may be used in the voltage measurement circuitry which may have an associated cost saving.

The resistive bias network may also have a resistor or resistors of known resistance connected between the bias point and the known potential. The known potential may be provided by a battery, such as a vehicle battery and may be stepped up to a suitable potential, for example about 55 Volts. The values of the resistors in the resistive bias network may determine the maximum detectable resistance of a short circuit. Short circuits of higher resistance may be detected if higher resistance resistors are used in the resistive bias network. A short circuit in the order of about 100 kΩ is detectable when the resistive bias network comprises resistors in the order of about 100 kΩ.

A charge switch may be provided in the drive circuit, the charge switch being operable to connect the injector bank to the charge circuit when the charge switch is closed. In one embodiment of the invention, the bias voltage is measured with the injector bank disconnected from the charge circuit, that is with the charge switch open.

A discharge switch may be provided in the drive circuit, the discharge switch being operable to connect the injector bank to the discharge circuit when closed. In one embodiment of the invention, the bias voltage is measured with the injector bank disconnected from the discharge circuit, that is with the discharge switch open.

The or each injector may be individually selectable into the discharge circuit. An injector select switch may be provided in series with the or each injector, the injector select switch being operable to select the associated injector into the discharge circuit when closed. In one embodiment of the invention, the bias voltage is measured with the or each injector deselected from the discharge circuit, that is with the or each injector select switch open.

A major short circuit fault, e.g. a short circuit of relatively low resistance, may prevent the injectors from being charged when the injector bank is connected to the charge circuit. A minor short circuit fault, e.g. one of relatively high resistance, may not prevent the injectors from charging, but may have an adverse affect on the amount of fuel injected, which in turn may affect performance or emissions of the vehicle. The method may include shutting down the associated injector bank if an extreme short circuit fault is detected. The injector bank may not be shut down if only a minor short circuit is detected. The method may further comprise defining two tolerances voltages, and generating a minor fault signal if the voltage at the bias point is outside the first tolerance but within the second tolerance, and generating a major fault signal if the voltage at the bias point is outside the second tolerance. The method may also include alerting a user, such as a vehicle operator, when a minor fault and/or a major fault is detected, for example by illuminating a warning light on an instrument panel of the vehicle.

According to a second aspect of the present invention there is provided a fault detection method for detecting faults in an injector arrangement at engine start-up, the injector arrangement comprising at least one piezoelectric fuel injector, and the method comprising:

(a) charging the injector during a charge phase;

(b) allowing a delay period to elapse following the charge phase;

(c) providing a discharge current path during the delay period through which the injector can discharge if there is an injector low side to ground short circuit;

(d) attempting to recharge the injector during a recharge phase following the delay period;

(e) sensing a current through the injector during the recharge phase; and (f) generating a first fault signal if the sensed current exceeds a first predetermined threshold current.

A non-faulty injector should not discharge substantially during the delay period. Therefore substantially no current should flow during the recharge phase for a non-faulty injector. However, if a substantial current does flow during the recharge phase, that is a current in excess of the first predetermined threshold current, then this indicates that one or more of the injectors in the injector bank has discharged during the delay period, and hence a current flows during the recharge phase to recharge the or each faulty injector.

The first fault signal is generated if one or more of the injectors in the injector bank has a stack terminal short circuit or an injector low side to ground short circuit. The provision of the discharge current path allows an injector having a low side to ground short circuit to discharge through that short circuit during the delay period. This is then detected by the current flow during the delay period which flows to recharge the discharged injector.

The discharge current path may be provided by connecting the injector bank to the discharge circuit during the delay period, for example by closing the discharge switch associated with the discharge circuit. If a low side to ground short circuit is present, then closing the discharge switch effectively serves to complete a discharge current loop comprising the low side to ground short circuit.

A number of factors will determine the amount by which a faulty injector discharges during the delay period. These factors include the inherent resistance of the short circuit, the length of the delay period, and the charge on the injector after the charge phase. The first predetermined threshold current level may be set so that only short circuits below a predetermined resistance trigger the first fault signal. As described above in relation to the first aspect of the invention, on detection of a fault, activity on the injector bank may be suspended.

The injectors may be fully charged or only partially charged during the charge phase. A small calibratable voltage, for example about 20 V, may be generated in the charge circuit and the injector charged to this voltage during the charge phase. If only a small voltage is applied to the piezoelectric stack during the charge phase, only a very low fuel pressure is required to perform the tests; this makes the method suitable for use at engine start-up because the fuel will not yet have been pressurised to a high level.

In one embodiment of the invention, the bias voltage is measured with the or each injector deselected from the discharge circuit, that is with the or each injector select switch open.

If a first fault signal is generated, then in order to identify whether the fault is a stack terminal short circuit or an injector low side to ground short circuit, the method may comprise further diagnostic steps, but this time without providing a discharge current path, so that if the fault is a low side to ground short circuit, the injector is prevented from discharging. Therefore, if a fault is still detected, it can be attributed to a stack terminal short circuit. The further method steps comprise:

(g) charging the injector during a further charge phase;

(h) allowing a further delay period to elapse without forming the discharge current path;

(i) attempting to recharge the injector during a further recharge phase;

(j) sensing the current through the injector during the further recharge phase; and (k) generating a second fault signal indicative of a short circuit between the terminals of the injector if the current sensed exceeds a second predetermined threshold current.

If a second fault signal is not generated, then it can be deduced that the first fault signal was attributable to a low side to ground short circuit. Hence the method may further comprise:

(l) generating a third fault signal indicative of an injector low side to ground short circuit if the current sensed during the further recharge phase does not exceed the second predetermined threshold current.

As a further step, upon generation of the second or third fault signals, the method may comprise recording in a memory device that the first fault signal represents, respectively, a stack terminal short circuit or an injector low side to ground short circuit.

Alternatively, or additionally, stack terminal short circuits can be differentiated from low side to ground short circuits by monitoring current flow in the discharge current path during the delay period of step (b). If a current is detected, or at least a current exceeding a predetermined threshold level is detected, then this indicates that there is a low side to ground short circuit. Therefore, the method may further comprise the following steps: sensing a discharge current in the discharge current path during the delay period of step (b); and generating a fourth fault signal indicative of an injector low side to ground short circuit if a discharge current exceeding a third predetermined threshold current is sensed in the discharge current path during the delay period.

If a discharge current is not detected in the discharge current path, but an injector still discharges during the delay period of step (b), then it can be deduced that the first fault signal is indicative of a stack terminal short circuit. Therefore, in this case, the method may further comprise recording in a memory device that the first fault signal represents a stack terminal short circuit.

For the avoidance of doubt, the second and third predetermined threshold currents may be the same as, or different to, the first predetermined threshold current.

The current in the discharge path may be detected by a current sensing device at any one of a number of points in the drive circuit. For example individual current sensors may be connected in series with the injectors. This allows the short circuit to be tracked to a particular injector. The method may therefore comprise monitoring the current in a plurality of current paths and recording the location of the low side to ground short circuit in the memory device in response to the fourth fault signal.

It will be appreciated that the first and second aspects of the invention, and the optional steps associated therewith, may be combined in any suitable combination to form a diagnostic routine for detecting and diagnosing a range of short circuit faults at engine start-up. Such a diagnostic routine would provide a robust method of detecting both high side to ground and low side to ground short circuits at engine start-up, in addition to stack terminal short circuits.

The diagnostic methods of the invention are capable of detecting a variety of short circuit faults having a wide-range of resistance values. The ability to detect a wide-range of resistance values is particularly advantageous, because it enables the diagnostic methods of the invention to detect short circuit faults that would otherwise remain undetected at engine start-up, but which may prevent the engine from being started. The diagnostic methods of the invention can be performed rapidly, and as such have substantially no net effect on the time to first fire at engine start-up.

The inventive concept encompasses a computer program product comprising at least one computer program software portion which, when executed in an executing environment, is operable to implement any or all of the methods described above. The inventive concept also encompasses a data storage medium having the or each computer software portion stored thereon, and a microcomputer provided with said data storage medium.

BRIEF DESCRIPTION OF THE DRAWINGS

The invention will now be described, by way of example, with reference to the accompanying drawings, in which.

DETAILED DESCRIPTION OF THE PREFERRED EMBODIMENTS

Figure 1:
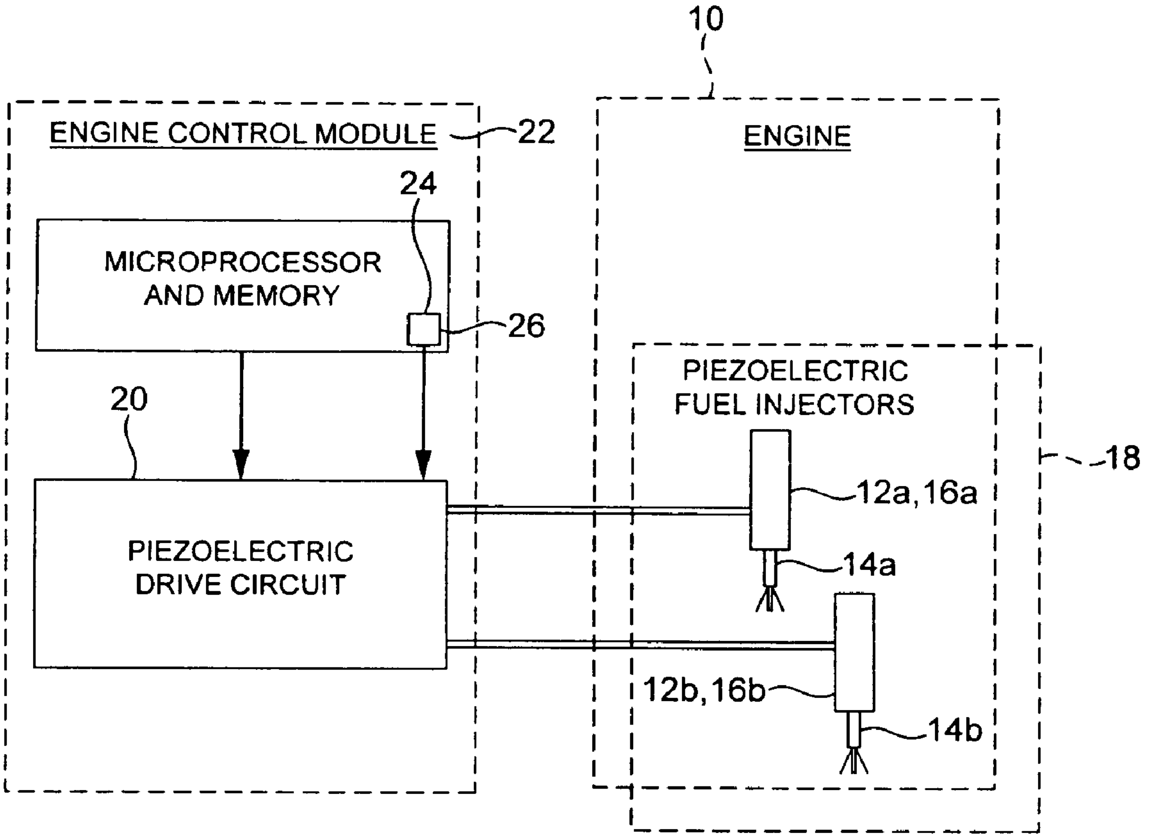
FIG. 1 is a block diagram illustrating a drive circuit for controlling an injector arrangement comprising a bank of piezoelectric fuel injectors in an engine.

Referring to FIG. 1, an engine 10, such as an automotive vehicle engine, is shown having a fuel injector arrangement comprising a first fuel injector 12*a* and a second fuel injector 12*b*. The fuel injectors 12*a*, 12*b* each have an injector valve needle 14*a*, 14*b* respectively, and a piezoelectric actuator 16*a*, 16*b* respectively. The piezoelectric actuators 16*a*, 16*b* are operable to cause the injector valve needle 14*a*, 14*b* of the associated injector 12*a*, 12*b* to open and close to control the injection of fuel into an associated cylinder of the engine 10. The fuel injectors 12*a*, 12*b* may be employed in a diesel internal combustion engine to inject diesel fuel into the engine 10, or they may be employed in a spark ignited internal combustion engine to inject combustible gasoline into the engine 10.

The fuel injectors 12*a*, 12*b* form an injector bank 18 and are controlled by a drive circuit 20. In practice, the engine 10 may be provided with more than one injector bank 18, and each injector bank 18 may have one or more fuel injectors 12*a*, 12*b*. For reasons of clarity, the following description relates to only one injector bank 18. In the embodiments of the invention described below, the fuel injectors 12*a*, 12*b* are of a negative-charge displacement type, i.e. 'discharge-to-inject' injectors. The fuel injectors 12*a*, 12*b* are therefore opened to inject fuel into the engine cylinder during a discharge phase and closed to terminate injection of fuel during a charge phase.

The engine 10 is controlled by an Engine Control Module (ECM) 22, of which the drive circuit 20 forms an integral part. The ECM 22 includes a microprocessor 24 and a memory 26 which are arranged to perform various routines to control the operation of the engine 10, including the control of the fuel injector arrangement. Signals are transmitted between the microprocessor 24 and the drive circuit 20 and data which is comprised in the signals received from the drive circuit 20 is recorded in the memory 26. The ECM 22 is arranged to monitor engine speed and load. It also controls the amount of fuel supplied to the injectors 12*a*, 12*b* and the timing of operation of the injectors 12*a*, 12*b*. The ECM 22 is connected to a vehicle battery (not shown) which has a battery voltage of about 12 Volts. Further detail of the operation of the ECM 22 and its functionality in operating the engine 10, particularly the injection cycles of the injector arrangement, is described in detail in WO 2005/028836A1.

Figure 2:
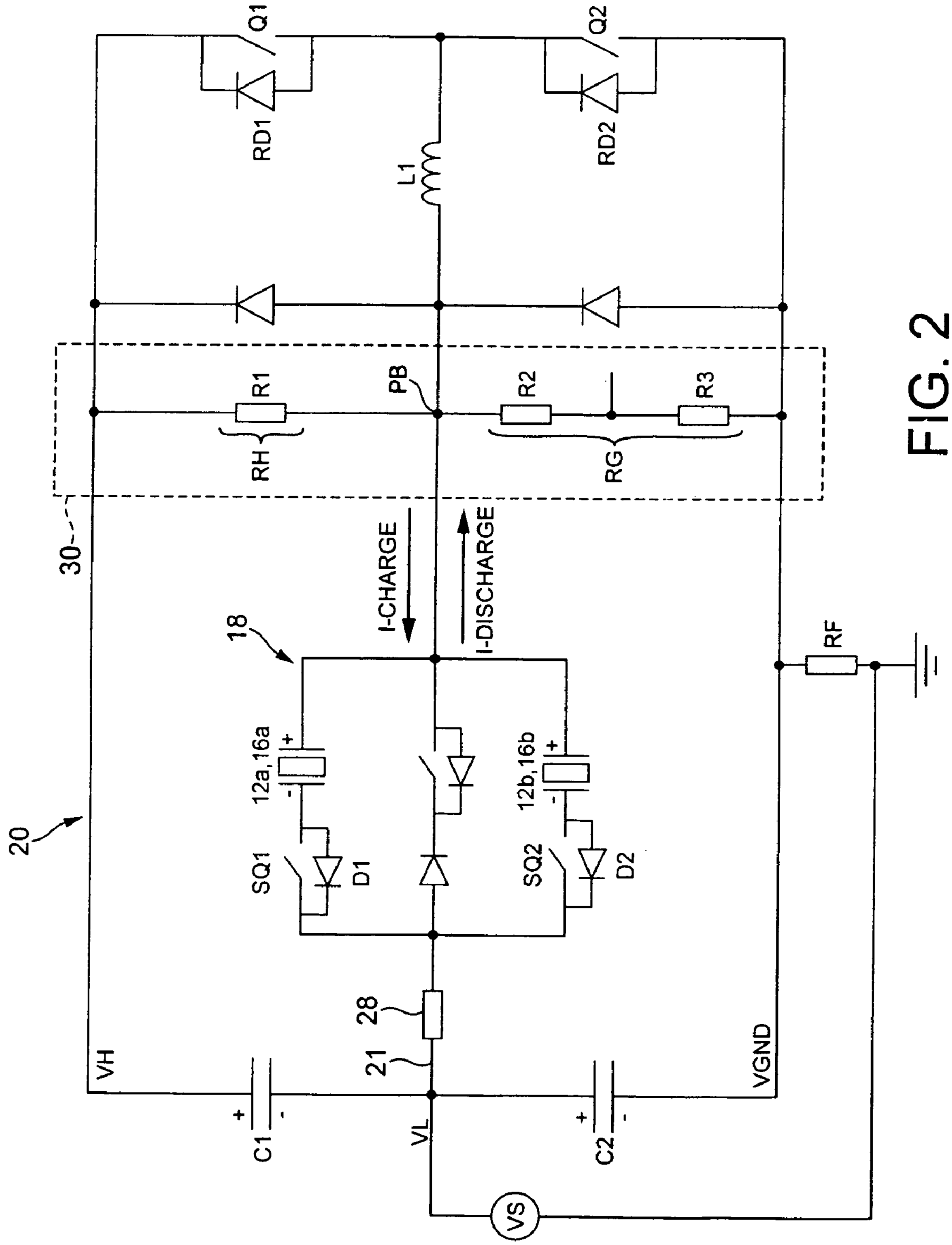
FIG. 2 is a circuit diagram illustrating the drive circuit in FIG. 1 in more detail, including a bias point PB.

FIG. 2 shows the drive circuit 20 for the pair of fuel injectors 12*a*, 12*b* in further detail. The drive circuit 20 includes high, low and ground voltage rails VH, VL and VGND respectively. The drive circuit 20 is generally configured as a half H-bridge with the low voltage rail VL serving as a bi-directional middle current path 21. The piezoelectric actuators 16*a*, 16*b* of the injectors 12*a*, 12*b* (FIG. 1) are connected in the middle circuit branch 21. The piezoelectric actuators 16*a*, 16*b* are located between, and coupled in series with, an inductor L1 and a current sensing and control device 28.

The piezoelectric actuators 16*a* and 16*b* (hereinafter referred to simply as 'actuators') are connected in parallel. Each actuator 16*a*, 16*b* has the electrical characteristics of a capacitor and is chargeable to hold a voltage which is the potential difference between its high (+) and low (−) terminals. Each actuator 16*a*, 16*b* is connected in series with a respective injector select switch SQ1, SQ2, and each injector select switch SQ1, SQ2 has a respective diode D1, D2 connected across it.

Voltage source VS is connected between the low voltage rail VL and the ground rail VGND of the drive circuit 20. The voltage source VS may be provided by the vehicle battery (not shown) in conjunction with a step-up transformer (not shown) for increasing the voltage from the battery to the required voltage of the low voltage rail VL.

A first energy storage capacitor C1 is connected between the high and low voltage rails VH, VL, and a second energy storage capacitor C2 is connected between the low and ground voltage rails VL, VGND. The capacitors C1, C2 store energy which is used to charge and discharge the actuators 16*a*, 16*b* during the charge and discharge phases respectively. A charge switch Q1 is connected between the high and low voltage rails VH, VL, and a discharge switch Q2 is connected between the low voltage and ground rails VL, VGND. Each switch Q1, Q2 has a respective diode RD1, RD2 connected across it for allowing current to return to the capacitors C1, C2 during a regeneration phase to replenish the capacitors C1, C2. For brevity, the regeneration process is not described herein, but is described in detail in co-pending applications WO 2005/028836A1 and EP 06256140.2.

A fault trip resistor RF, for detecting certain types of low resistance short circuits to ground in the injector arrangement, is connected between the ground rail VGND and ground. The fault trip resistor RF is of very low resistance, of the order of milliohms, and hence the voltage on the ground rail VGND is substantially zero Volts. It should be appreciated that the fault trip resistor RF is not essential to this invention, and accordingly its operation is not described herein, but is described in the co-pending patent application EP 06251881.6.

A resistive bias network 30 is connected across the high voltage rail VH and ground rail VGND and intersects the middle circuit branch 21 at a bias point PB. The resistive bias network 30 includes first, second and third resistors R1, R2, R3 connected together in series. The first resistor R1 is connected between the high voltage rail VH and the bias point PB, and the second and third resistors R2 and R3 are connected in series between the bias point PB and the ground rail VGND. The second resistor R2 is connected between the bias point PB and the third resistor R3; and the third resistor R3 is connected between the second resistor R2 and the ground rail VGND.

The first, second and third resistors R1, R2, R3 each have a known resistance of a high order of magnitude. The first resistor R1 has a resistance which is hereafter referred to as RH, and the second and third resistors R2, R3 have a combined resistance (R2+R3) hereafter referred to as RG. RH and RG are each typically of the order of hundreds of kiloohms. It will be appreciated that a single resistor could replace R2 and R3.

The voltage across R3 is measured, and from this, the bias voltage VB across the combined resistance RG of the second and third resistors R2, R3, is inferred. Alternatively, the bias voltage VB could be determined directly, by measuring the potential difference across RG. The voltage measurement is carried out by an analogue to digital (A/D) module of the microprocessor 24. In this example, the A/D module has a maximum input voltage of 5 V, and so the scaling of R2 and R3 is such that the voltage across R3 should not exceed 5 V.

In essence, the drive circuit 20 comprises a charge circuit and a discharge circuit. The charge circuit comprises the high and low voltage rails VH, VL, the first capacitor C1 and the charge switch Q1, whereas the discharge circuit comprises the low voltage and ground rails VL, VGND, the second capacitor C2 and the discharge switch Q2. The operation of the drive circuit is described in co-pending patent applications EP 06254039.8 and EP 06256140.2, and the contents of each of these documents is incorporated herein by reference. However, for ease of reference, the charge and discharge phases of operation of the drive circuit 20 are briefly outlined below.

To charge the actuators 16*a*, 16*b* during the charge phase, the charge switch Q1 is closed and the discharge switch Q2 remains open. The first capacitor C1, when fully charged, has a potential difference of about 200 Volts across it, and so closing the charge switch Q1 causes current to flow around the charge circuit, from the positive/high terminal of the first capacitor C1, through the charge switch Q1 and the inductor L1 (in the direction of the arrow 'I-CHARGE'), through the actuators 16*a* and 16*b* (from the high sides + to the low sides −) and associated diodes D1 and D2 respectively, through the current sensing and control device 28, and back to the negative/low terminal of the first capacitor C1.

To commence an injection event, the drive circuit 20 operates in the discharge phase, wherein one of the previously charged actuators 16*a*, 16*b* is discharged. During the discharge phase, an injector 12*a* or 12*b* (FIG. 1) is selected for injection by closing the associated injector select switch SQ1 or SQ2 respectively, the discharge switch Q2 is closed and the charge switch Q1 remains open. For example, to inject from the first injector 12*a*, the first injector select switch SQ1 is closed and current flows from the positive terminal of the second capacitor C2, through the current sensing and control device 28, through the actuator 16*a* of the selected first injector 12*a* (from the low side − to the high side +), through the inductor L1 (in the direction of the arrow 'I-DISCHARGE'), through the discharge switch Q2 and back to the negative side of the second capacitor C2. No current is able to flow through the actuator 16*b* of the deselected second injector 12*b* because of the diode D2 and because the associated injector select switch SQ2 remains open.

To terminate the injection event, the selected injector 12*a* or 12*b* is deselected by opening the associated injector select switch SQ1 or SQ2, the discharge switch Q2 is opened and the charge switch Q1 is closed to recharge the previously discharged injector 12*a* or 12*b*, thereby causing the piezoelectric stack to expand and thus the injector valve needle 14*a*, 14*b* of the associated injector 12*a*, 12*b* (FIG. 1) of the injector 12*a* to close.

There now follows a description of a high side to ground short circuit detection method.

Figure 3:
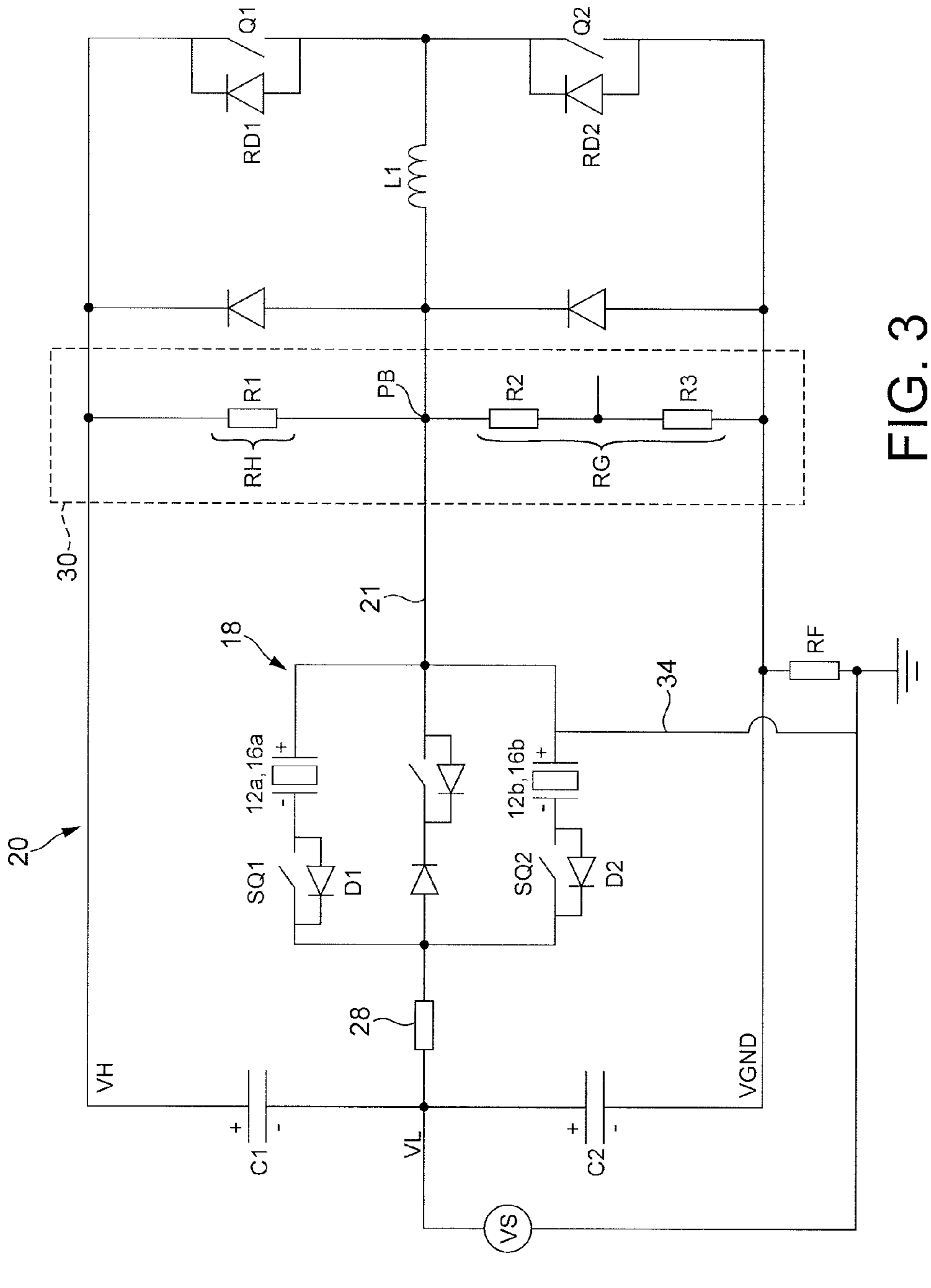
FIG. 3 is the drive circuit of FIG. 2, but in which one of the injectors has a high side to ground short circuit.

Referring to FIG. 3, this is the drive circuit 20 of FIG. 2, but in which the second injector 12*b* has a high side to ground short circuit 34. In order to detect a high side to ground short circuit 34 at engine start-up, the resistive bias network 30 is used to determine the bias potential VB at the bias point PB before a high voltage is generated on the high voltage rail VH for charging the injectors 12*a*, 12*b*. The bias potential VB is measured with no injector 12*a*, 12*b* selected, that is when both injector select switches SQ1 and SQ2 are open.

The measured bias potential VB is compared to a predicted voltage VPB, which is the potential that would be expected at the bias point PB if both the injectors 12*a*, 12*b* in the injector bank 18 are functioning correctly, that is in the absence of any high side to ground short circuits 34.

If the measured bias potential VB is substantially equal to the predicted voltage VPB, or within a predetermined tolerance of the predicted voltage VPB, then this indicates that there are no high side to ground short circuits 34 in the injector bank 18. However, if the measured bias voltage VB is lower than the predicted voltage VPB, or below a predetermined tolerance voltage of the predicted voltage VPB, then this indicates that one or both of the injectors 12*a*, 12*b* has a high side to ground short circuit 34.

The predicted voltage VPB at the bias point PB is derived as follows:

$$V_{PB}=IR_G \quad (1)$$

and $$V_H=I(R_H+R_G) \quad (2)$$

where I is the current through the resistive bias network 30.

Hence the bias potential is calculated by equation 3 below:

$$V_{PB}=\frac{V_H R_G}{R_H+R_G} \quad (3)$$

However, at engine start-up, the potential difference across the first capacitor C1 is substantially zero Volts before the high voltage rail VH is generated, hence the potential of the high voltage rail VH is substantially equal to the voltage of the voltage source VS.

Therefore, the value of the predicted bias voltage VPB with no injector 12*a*, 12*b* selected is given by equation 4 below:

$$V_{PB}=\frac{V_S R_G}{R_H+R_G} \quad (4)$$

Since VS, RH and RG are all known, VPB can be calculated using equation 4 above.

If either of the injectors 12*a* or 12*b* has a high side to ground short circuit 34, then this acts as if there is a resistor connected in parallel with the resistance RG in the resistive bias network 30, as shown in FIG. 3.

The effective resistance RG* between the bias point PB and the ground rail VGND would then be calculated by equation 5 below:

$$RG^*=\frac{1}{\left(\frac{1}{R_{SC}}+\frac{1}{R_G}\right)} \quad (5)$$

Where RSC is the resistance of the high side to ground short circuit 34.

The measured bias voltage VB with no injector 12*a*, 12*b* selected, that is with both injector select switches SQ1 and SQ2 open, would then be given by equation 6 below:

$$V_B = \frac{V_S R_{G^*}}{R_H + R_{G^*}} \quad 6$$

Figure 4A:
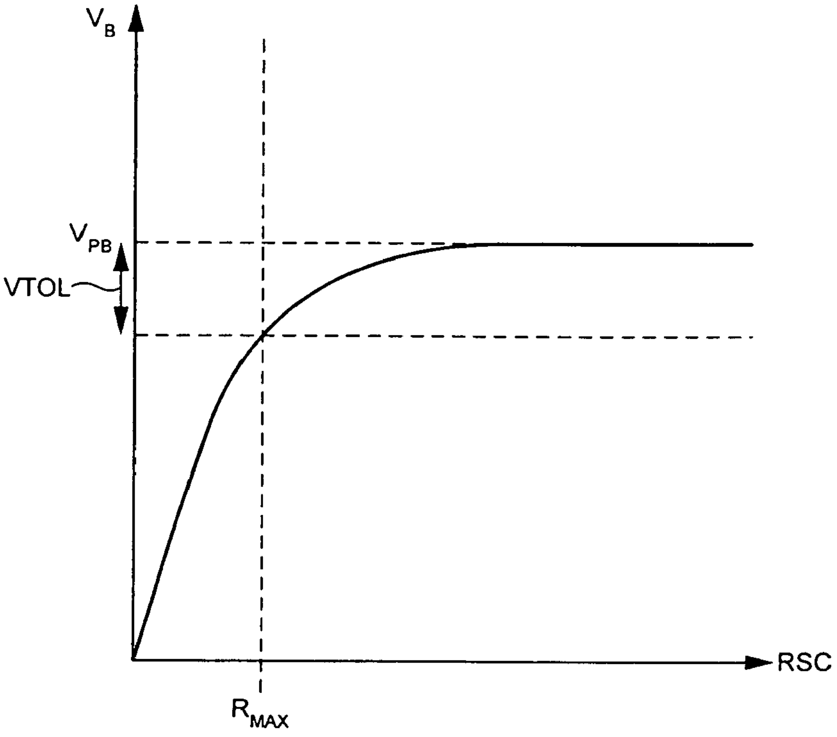
FIG. 4*a* is a plot of the potential determined at the bias point PB versus the resistance RSC of the high side to ground short circuit in FIG. 3.

FIG. 4*a* is a plot of the measured bias voltage VB versus the resistance RSC of the high side to ground short circuit 34. It can be seen from FIG. 4*a*, that the measured bias voltage VB decreases from the predicted voltage VPB as the resistance RSC of the high side to ground short circuit 34 decreases. Therefore if the measured bias voltage VB is lower than the predicted bias voltage VPB, this may be indicative of a high side to ground short circuit 34. The measured bias voltage VB will always be lower than the predicted bias voltage VPB if there is a high side to ground short circuit 34, regardless of the voltages on the piezoelectric stacks of the injectors 12*a*, 12*b*. This makes this technique particular useful at engine start-up because the voltages on the piezoelectric stacks are generally not known at start-up.

In practice, the measured bias voltage VB is compared to the predicted voltage VPB, and if the measured bias voltage VB is outside a tolerance range VTOL of the predicted voltage VPB, then a fault is reported. The tolerance range can be calibrated so that the range of faults detected can be varied according to the particular requirements of the system. A tolerance voltage range VTOL is indicated on FIG. 4*a*, and it can be seen that the tolerance voltage range VTOL defines a maximum short circuit resistance RMAX. The tolerance voltage range VTOL is set so that short circuits faults of lower resistance than the maximum short circuit resistance RMAX cause a fault signal to be generated.

Figure 4B:
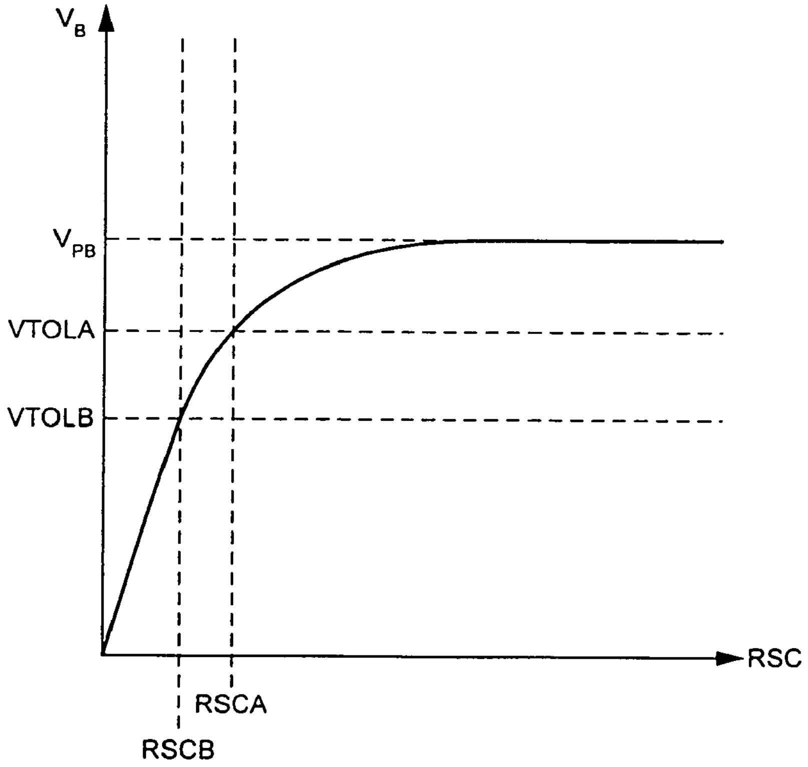
FIG. 4*b* is a plot similar to that in FIG. 4*a*, showing how major and minor short circuits may be distinguished.

FIG. 4*b* is a plot similar to that of FIG. 4*a*, and illustrates how major short circuits (of relatively low resistance) and minor short circuits (of relatively high resistance) can be distinguished. A pair of voltage thresholds VTOLA and VTOLB is indicated in FIG. 4*b*. VTOLA corresponds to an upper short circuit resistance threshold RSCA, and VTOLB corresponds to a lower short circuit resistance threshold RSCB. A minor short circuit fault, i.e. one having a resistance between RSCA and RSCB, is detected if the voltage measured at the bias point PB is between the first and second voltage thresholds VTOLA and VTOLB; a major short circuit fault, i.e. one having a resistance less than RSCB, is detected if the voltage at the bias point PB is less than the second voltage threshold VTOLB.

A method for detecting short circuits between the stack terminals (+/−) of the piezoelectric actuators 16*a*, 16*b* of the injectors 12*a*, 12*b* at engine start-up is disclosed in the co-pending patent application EP 06256140.2, the content of which is incorporated herein by reference as aforesaid. The method uses a 'charge pulse' technique including generating a charge voltage on the high voltage rail VH; performing a first charge pulse on the injector bank 18 by closing the charge switch Q1 for a predetermined period of time; performing a second, or 'recharge', charge pulse on the injector bank 18 after a predetermined delay period Δt, again by closing the charge switch Q1; and monitoring the current through the injectors 12*a*, 12*b* using the current sensing and control device 28. This method is performed with the injector bank 18 disconnected from the discharge circuit, that is with the discharge switch Q2 open.

If a current is detected during the second charge pulse, or at least if a current in excess of a predetermined threshold current is detected, this indicates that the voltage on at least one piezoelectric stack 1 6*a* or 1 6*b* on the injector bank 18 has decayed since the first charge pulse, and hence at least one of the injectors 12*a*, 12*b* has a short circuit between its piezoelectric stack terminals (+/−). This is because a 'good' injector 12*a*, 12*b*, that is a non-faulty injector 12*a*, 12*b*, should hold its charge during the delay period Δt, whereas an injector 12*a*, 12*b* with a stack terminal short circuit will discharge at least partially through the short circuit during the delay period Δt, hence a current will flow during the second charge pulse to recharge the faulty injector 12*a*, 12*b*.

There now follows a description of a low side to ground short circuit detection method.

Although the charge pulse method described in EP 06256140.2 enables stack terminal short circuit faults to be detected at engine start-up, it cannot detect injector low side to ground short circuits in the injector bank 18. A low side to ground short circuit 36 on the second injector 12*b* is shown in the drive circuit 20 of FIG. 5. To detect a low side to ground short circuit 36, a modified charge-pulse method is used as described below. As with the charge-pulse method described above, the modified charge-pulse method is also able to detect stack terminal short circuit faults.

Figure 5:
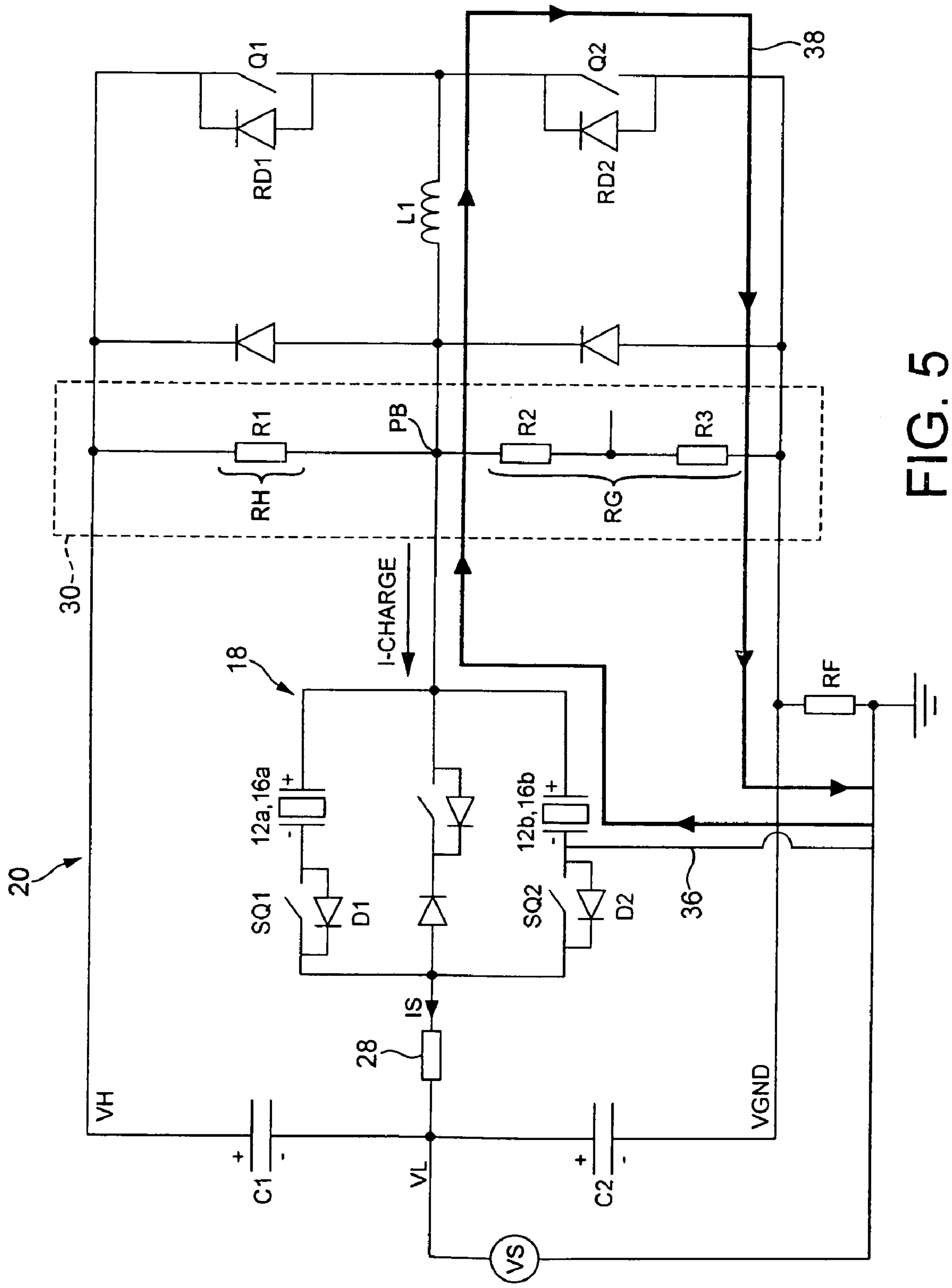
FIG. 5 is the drive circuit of FIG. 2, but in which one of the injectors has a low side to ground short circuit, and in which a discharge current path is shown.

The modified charge-pulse method comprises closing the discharge switch Q2 during the delay period Δt following the first charge pulse, as shown in FIG. 5. The individual injectors 12*a*, 12*b* are not selected into the discharge circuit during the delay period Δt, that is the injector select switches SQ1 and SQ2 remain open. For a non-faulty injector 12*a*, 12*b*, a current should not flow if only the discharge switch Q2 is closed, and the other switches (Q1, SQ1, SQ2) are open. However, the second injector 12*b* in FIG. 5 is faulty and has an injector low side to ground short circuit 36. In this case, closing the discharge switch Q2 completes a discharge current loop, as indicated by the arrows 38 in FIG. 5. The discharge current loop 38 comprises the low side to ground short-circuit 36, and closing the discharge switch Q2 causes the faulty second injector 12*b* to discharge, or at least partially discharge, through this low side to ground short circuit 36 during the delay period Δt.

When the second charge pulse is performed by opening the discharge switch Q2 and closing the charge switch Q1 after the delay period Δt, a current (IS) flows to recharge the discharged faulty injector 12*b*. This current is detected during the second charge pulse using the current sensing and control device 28, and indicates that at least one of the injectors 12*a*, 12*b* in the injector bank 18 has a short circuit and is hence faulty. If a current (IS), or at least a current exceeding a predetermined threshold current level is detected during the delay period Δt, then the microprocessor 24 generates a short-circuit fault signal, and this is recorded in the memory 26.

The current through the current sensing and control device 28 is monitored using a chop feedback method and circuitry as described in co-pending application EP 06256140.2, the content of which is incorporated herein by reference, as aforesaid. Essentially, the current sensing and control device 28 monitors current flow when the second charge pulse is performed. If there is a short circuit fault, then a current should flow when the second charge pulse is performed to recharge the faulty injector which will have discharged at least partially during the delay period Δt. The inherent resistance of the short circuit fault, and the length of the delay period Δt, together determine to what extent the faulty injector discharges, and hence how much current flows during the second charge pulse.

If the current sensed by the current sensing and control device 28 exceeds a predetermined threshold current level, this is indicative of a short circuit fault in the drive circuit with an inherent resistance below a predetermined resistance value. A control signal is generated at least during the second charge pulse. The control signal is fed back to the microprocessor and is variable between two discrete states. If the current sensed by the current sensing and control device 28 exceeds the predetermined threshold current level, then the control signal is chopped. The microprocessor 24 monitors for a chop in the control signal and generates a short circuit fault signal if a chop is detected.

It will be appreciated that if the injectors 12*a*, 12*b* are not faulty, then closing the discharge switch Q2 during the delay period Δt will not complete a discharge current loop 38 because a low side to ground short circuit 36 is not be present and because the injector select switches SQ1 and SQ2 remain open during the delay period Δt. Therefore, non-faulty injectors should substantially retain their charge during the delay period Δt, in which case the second charge pulse does not cause a current above the predetermined threshold current level to be detected, and hence a fault signal is not generated.

An example of a diagnostic routine comprising the modified charge pulse method for detecting low side to ground short circuits 36 is described below with reference to the flow chart of FIG. 6*a* and to the drive circuit in FIG. 5. In addition to the method steps for detecting low side to ground short circuits 36, the diagnostic routine also includes method steps for detecting open circuit faults associated with the various injectors 12*a*, 12*b*. It should be appreciated that testing for open circuit faults is not essential to this invention, but is described in co-pending application EP 06256140.2.

[Step A1] With the injector select switches SQ1, SQ2 open, a small calibratable voltage, of about 20 V, is generated on the high voltage rail VH.

[Step A2] Both injectors 12*a*, 12*b* on the injector bank 18 are then charged to the same voltage as the high voltage rail VH by closing the charge switch Q1 to perform a first charge pulse on the injector bank 18.

[Step A3] The charge switch Q1 is opened and the discharge switch Q2 is then closed. A predetermined time period Δt is allowed to elapse (the delay period Δt) [Step A4] before opening the discharge switch Q2 [Step A5].

[Step A6] The charge switch Q1 is re-closed after the predetermined time period Δt in order to attempt to perform a second charge pulse on the injector bank 18.

[Step A7] The current (IS) flowing during the second charge pulse is sensed using the current sensing and control device 28.

[Step A8] The sensed current (IS) is compared with a predetermined current level.

[Step A9] Finally, if the sensed current exceeds the predetermined current level, or is outside a tolerance of the predetermined current level, then one or more of the injectors 12*a*, 12*b* on the injector bank 18 has a short circuit; the short circuit is either a stack terminal short circuit or an injector low side to ground short circuit.

However, if the sensed current (IS) does not exceed the predetermined current level, or is not outside the tolerance of the predetermined current level, then neither of the injectors 12*a*, 12*b* on the injector bank 18 has a short circuit and the diagnostic routine proceeds to test the individual injectors 12*a*, 12*b* for open circuit faults as follows:

[Step A10] One of the injectors 12*a* or 12*b* on the injector bank 18 is selected into the discharge circuit by closing its associated injector select switch SQ1 or SQ2, and the discharge switch Q2 is closed during a discharge phase.

[Step A11] The selected injector 12*a* or 12*b* should discharge during the discharge phase as described earlier with reference to FIG. 2, and this discharge current is sensed using the current sensing and control device 28.

[Step A12] The discharge current sensed during the discharge phase is compared to a predetermined discharge current level.

[Step A13] Finally, if the sensed discharge current is less than the predetermined discharge current level, or is below a tolerance of the predetermined discharge current level, then the selected injector 12*a* or 12*b* has an open circuit fault. However, if the sensed discharge current exceeds the predetermined discharge current level, or exceeds the tolerance of the predetermined discharge current level, then the selected injector 12*a* or 12*b* does not have an open circuit fault.

[Step A14] If the selected injector 12*a* or 12*b* is not found to have an open circuit fault, then that injector 12*a* or 12*b* is deselected by opening its injector select switch SQ1 or SQ2 and another injector 12*a* or 12*b* is selected and tested for open circuit faults by repeating steps A10 to A12 above.

It will be appreciated that the short circuit faults detected in the methods described above could either be stack terminal short circuits or injector low side to ground short circuits 36 because both faults cause the associated injector 12*a* or 12*b* to discharge during the delay period Δt and, hence, a current to flow during the second charge phase.

In some instances it is desirable to be able to distinguish between stack terminal short circuits and injector low side to ground short circuits 36. These two types of short circuit fault can be distinguished from one another using either software or hardware methods as described in further detail below.

In one embodiment of the invention, a software solution is provided to distinguish between a stack terminal short circuit and an injector low side to ground short circuit 36. The software solution is a diagnostic subroutine which is executed in response to the detection of a short circuit at step A9 in the diagnostic routine of FIG. 6*a*. The subroutine essentially involves repeating the test sequence of charging the injectors 12*a*, 12*b*, waiting for a delay period Δt2, and attempting to recharge the injectors 12*a*, 12*b*, but this time leaving the discharge switch Q2 open during the delay period Δt2.

Figure 6A:
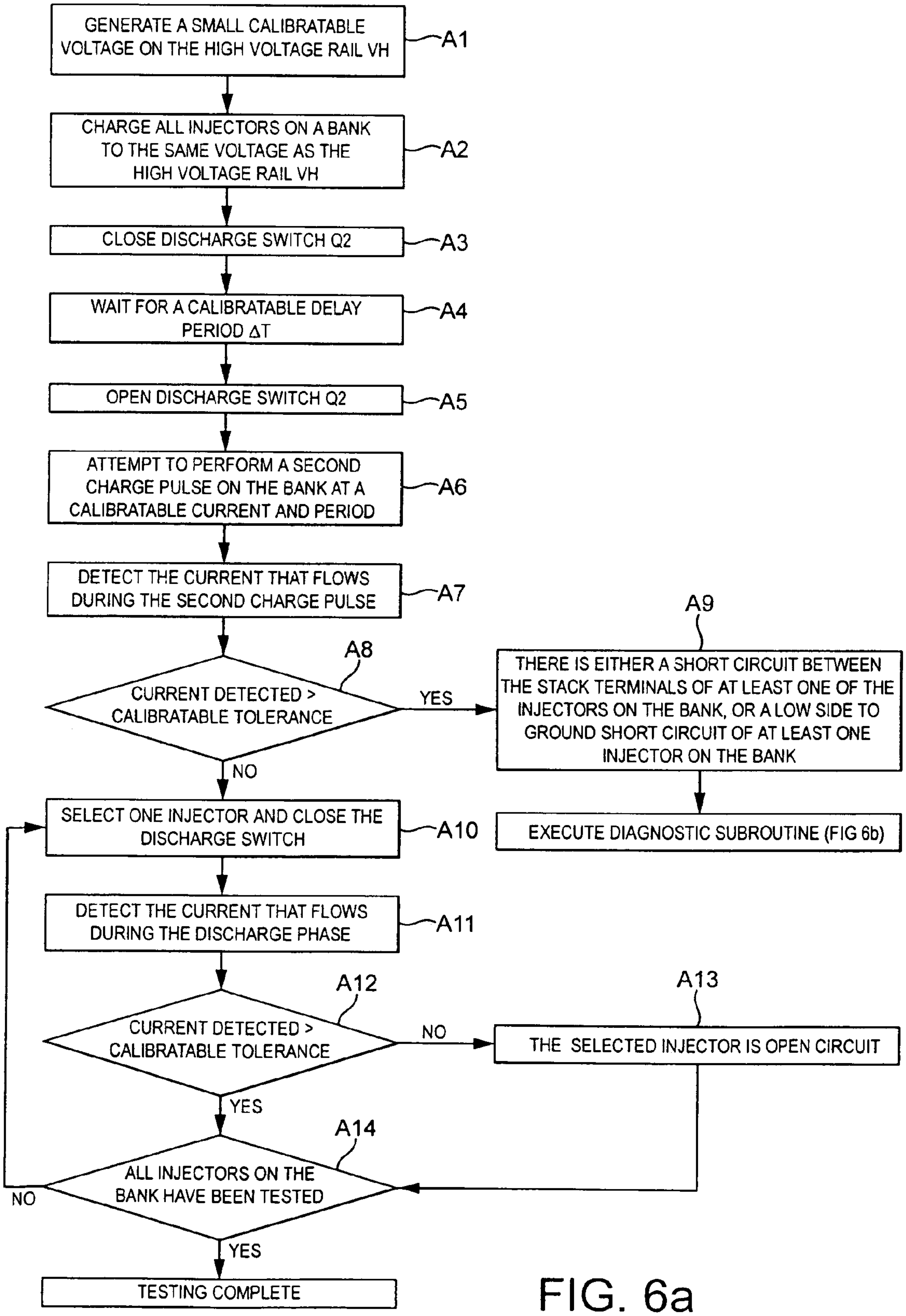
FIG. 6*a* is a flow chart of a diagnostic routine for detecting injector low side to ground short circuits, and stack terminal short circuits, at engine start-up.

If the short circuit detected during the main diagnostic routine of steps A1 to A8 of FIG. 6*a* is a low side to ground short circuit 36, then the faulty injector will not discharge during the delay period Δt2 of the diagnostic subroutine. Therefore, if no current, or a current not exceeding the predetermined threshold level, is detected by the current sensing and control device 28 during the second charge pulse of the diagnostic subroutine, there is an injector low side to ground short circuit 36 associated with one or more injectors 12*a* and/or 12*b* on the injector bank 18.

Otherwise, if a current exceeding the predetermined threshold current is still detected during the second charge pulse of the diagnostic subroutine, it can be deduced that there is a stack terminal short circuit on the injector bank 18, because this type of short circuit is detected irrespective of whether the discharge switch Q2 is open or closed during the delay period Δt/Δt2.

Figure 6B:
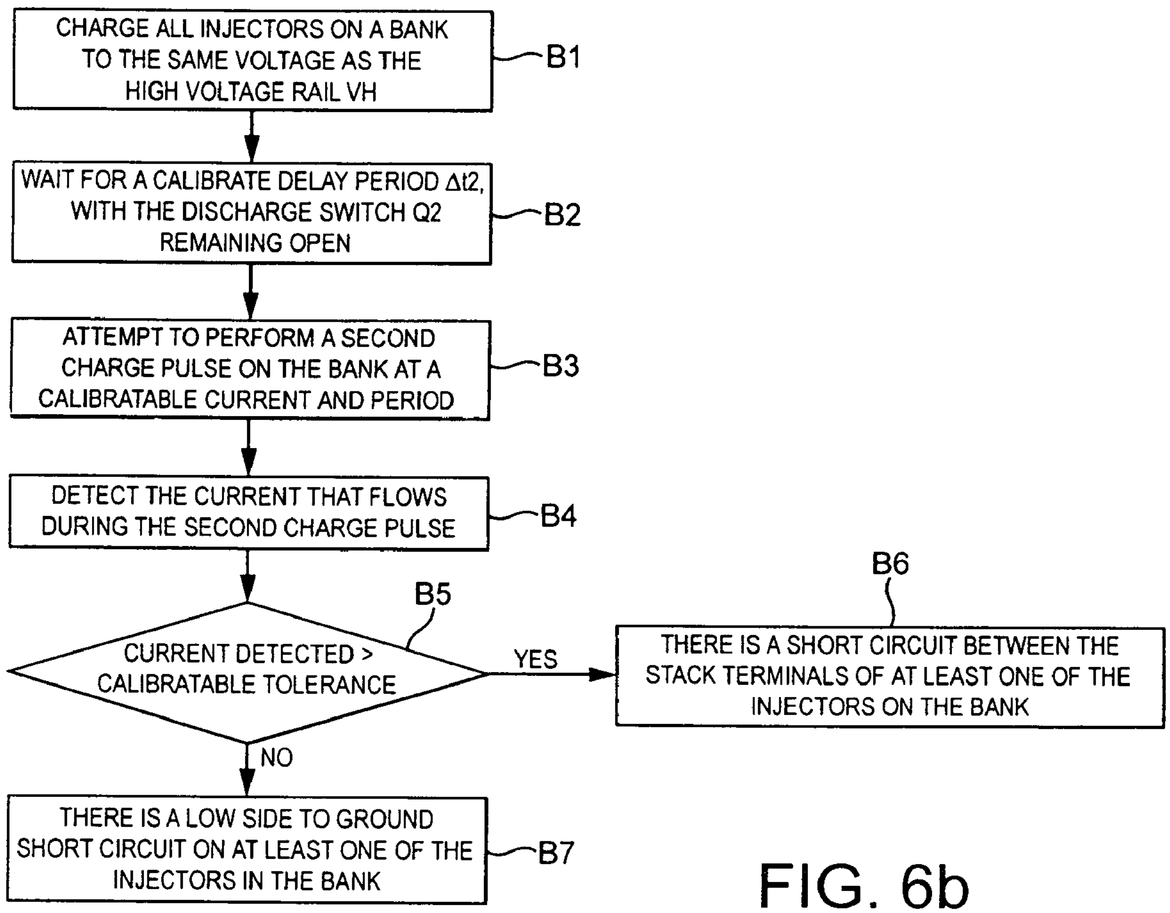
FIG. 6*b* is a flow chart of a diagnostic subroutine for distinguishing between an injector low side to ground short circuit and a stack terminal short circuit.

FIG. 6*b* is a flow chart showing the method steps of the diagnostic subroutine. The diagnostic subroutine is executed if a fault signal is generated in the main diagnostic routine of FIG. 6*a*, and the subroutine comprises the following steps:

[Step B1] A charge pulse is performed on the injector bank 18 by closing the charge switch Q1, thereby charging both injectors 12*a*, 12*b* to the potential of the high voltage rail VH.

[Step B2] The charge switch Q1 is opened, and a calibratable delay period Δt2 is allowed to elapse, during which period the discharge switch Q2 remains open.

[Step B3] A second charge pulse is performed on the injector bank 18 by re-closing the charge switch Q1.

[Step B4] The current (IS) flowing during the second charge pulse is detected using the current sensing and control device 28.

[Step B5] The sensed current (IS) during the second charge pulse is compared to a predetermined threshold current.

[Step B6] If the sensed current (IS) exceeds the predetermined threshold current level, then there is a stack terminal short circuit and a stack terminal fault signal is generated.

[Step B7] If the sensed current (IS) does not exceed the predetermined threshold current level, then there is a low side to ground short circuit and a low side to ground fault signal is generated.

The fault signals generated in the above methods are stored in the memory 26 together with a label identifying with which injector bank 18 the fault is associated with. Also stored in the memory 26 are any signals relating to the diagnoses of an open circuit fault associated with any of the injectors 12*a* or 12*b*.

Figure 7:
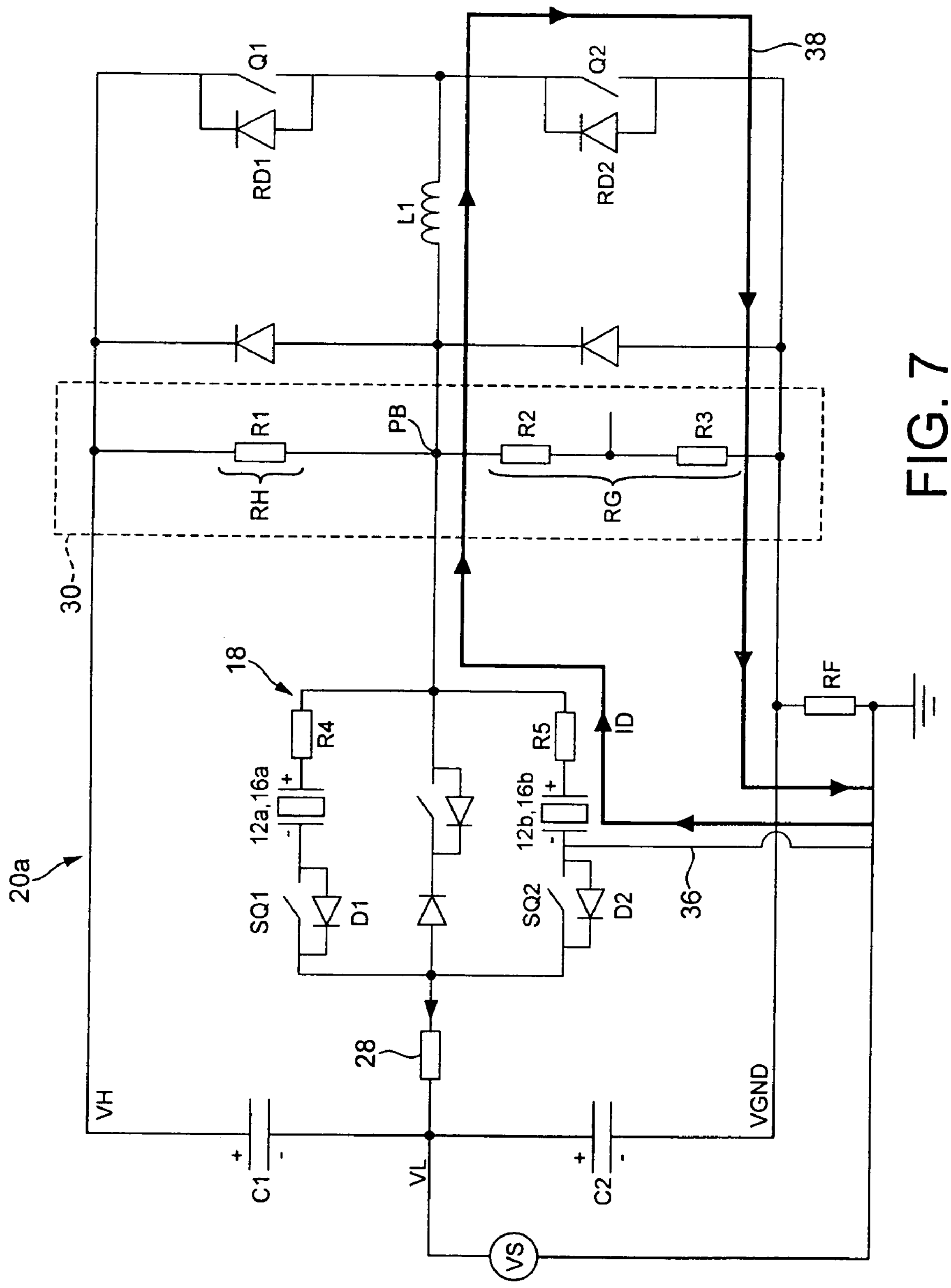
FIG. 7 is a drive circuit similar to the drive circuit of FIG. 2, but including a pair of current sensors connected in series with the respective injectors for detecting injector low side to ground short circuits.

Referring now to FIG. 7, this shows a hardware solution for distinguishing between injector low side to ground short circuits 36 and stack terminal short circuits. The drive circuit 20*a* in FIG. 7 is similar to the drive circuits 20 in FIGS. 2, 3 and 5, but also includes a pair of current sense resistors R4 and R5 connected in series with, and on the high sides (+) of, the respective injectors 12*a* and 12*b*. The current sense resistors R4, R5 can be used for monitoring current flow when the discharge switch Q2 is closed during the delay period Δt of step A4 in the main diagnostic routine of FIG. 6*a*.

As shown in FIG. 7, the second injector 12*b* has a low side to ground short circuit 36 and hence when the discharge switch Q2 is closed during the delay period Δt, the second injector 12*b* discharges, or discharges at least partially through this short circuit 36. A discharge current (ID) is detected by the second current sense resistor R5, which is connected in series with the second injector 12*b*. The detection of the discharge current (ID) is indicative of a low side to ground short circuit 36, and this is recorded in the memory 26 along with a record that the fault is associated with the second injector 12*b*.

If neither of the current sense resistors R4, R5 detected a low side to ground short circuit 36, then a fault detected by the current sensor 28 connected on the low side of the injectors 12*a*, 12*b* during the second charge pulse would indicate that one or both of the injectors 12*a*, 12*b* has a stack terminal short circuit.

It is also possible to distinguish between low side to ground short circuits 36 and stack terminal short circuits using just R4 and R5, and without the current sensor 28. For example, if a fault current 38 and a recharge current are detected through either R4 or R5, this would indicate a low side to ground short circuit. However, if a fault current 38 is not detected through either R4 or R5, but a recharge current is detected through R4 or R5, then this would indicate that there is a stack terminal short circuit.

Figure 8:
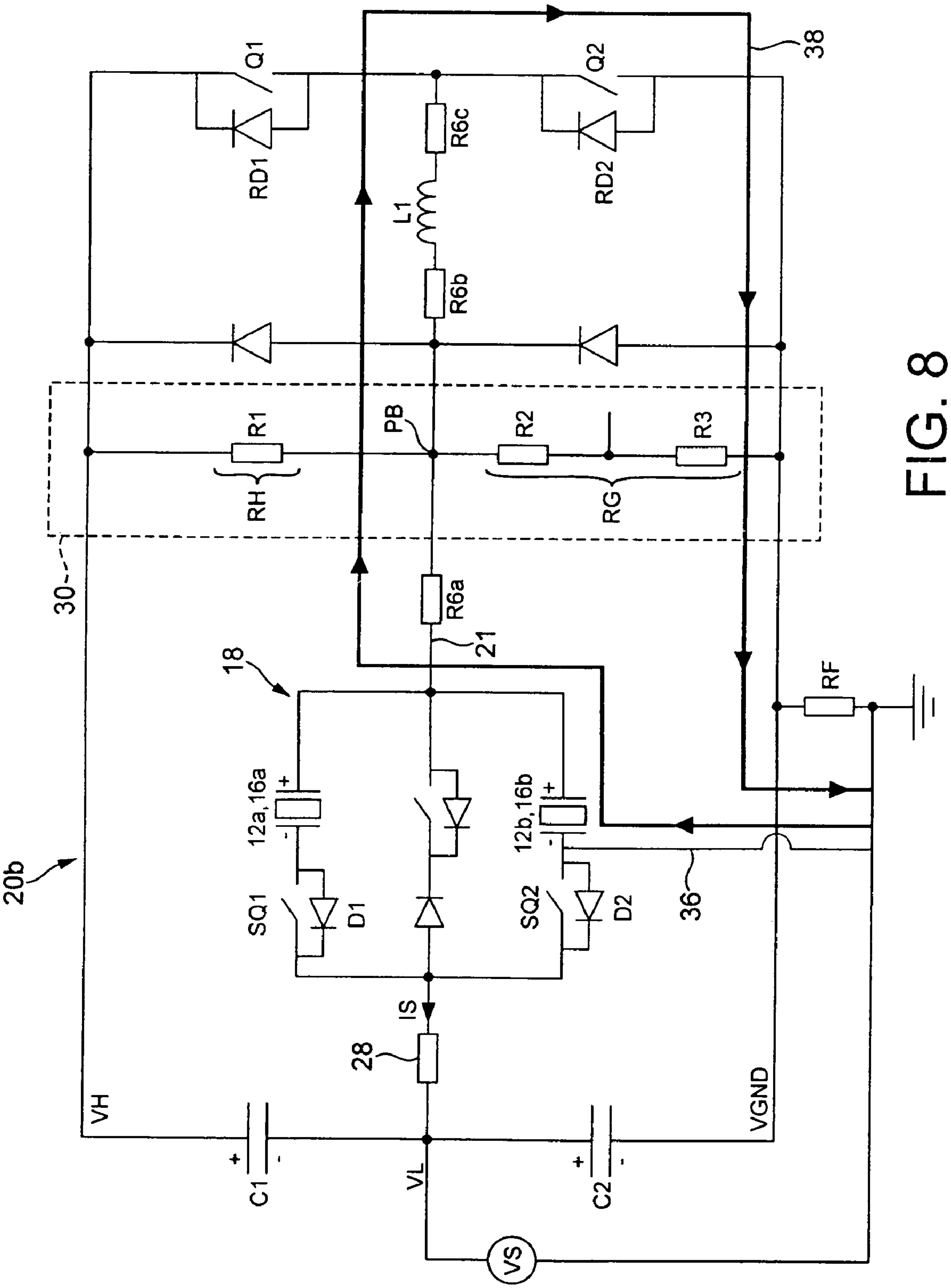
FIG. 8 is a drive circuit similar to the drive circuit of FIG. 2, and indicating three possible locations for a current sensor connected in series with the injector bank for detecting injector low side to ground short circuits.

Alternative hardware solutions for distinguishing between injector low side to ground short circuits 36 and stack terminal short circuits are shown in the drive circuit 20*b* of FIG. 8. The drive circuit 20*b* shows three possible locations for a current sense resistor R6 connected in the middle circuit branch 21 and in series with the injector bank 18 on the high side (+) of, the injectors 12*a*, 12*b*. The current sense resistor R6 may be located either between the injector bank 18 and the resistive bias network 30 (R6*a*); or between the resistive bias network 30 and the inductor L1 (R6*b*); or between the inductor L1 and the discharge switch Q2 (R6*c*).

The current sense resistor (R6*a,b* or *c*) in FIG. 8 is used to monitor current flow in the discharge current loop 38 during the delay period Δt between the first and second charge pulses in much the same way as the current sense resistors R4 and R5 described above with reference to FIG. 7. If a current is detected in the discharge loop 38 above a predetermined threshold current level, this indicates that one or both of the injectors 12*a* and/or 12*b* in the injector bank 18 has a low side to ground short circuit 36. Although the fault can be tracked to a particular injector bank 18, it cannot be tracked to a particular injector 12*a*, 12*b*, unlike with the arrangement shown in FIG. 7.

It will be appreciated that the opening and closing of the switches in the various methods and diagnostic routines described above is controlled by the microprocessor 24, and the various fault signals are output by the microprocessor 24 and recorded in the memory 26. Any of the methods described above may further comprise reading the memory device 26 to diagnose the fault. This step may be performed by an automotive engineer some time after the fault has been recorded in the memory, for example during engine servicing.

It will also be appreciated that if a fault signal is generated, then depending on the particular fault detected, the microprocessor may be programmed to disable all further activity on the injector bank 18; this may include the disabling of all subsequent discharge, charge and regeneration phases.

Figure 9:
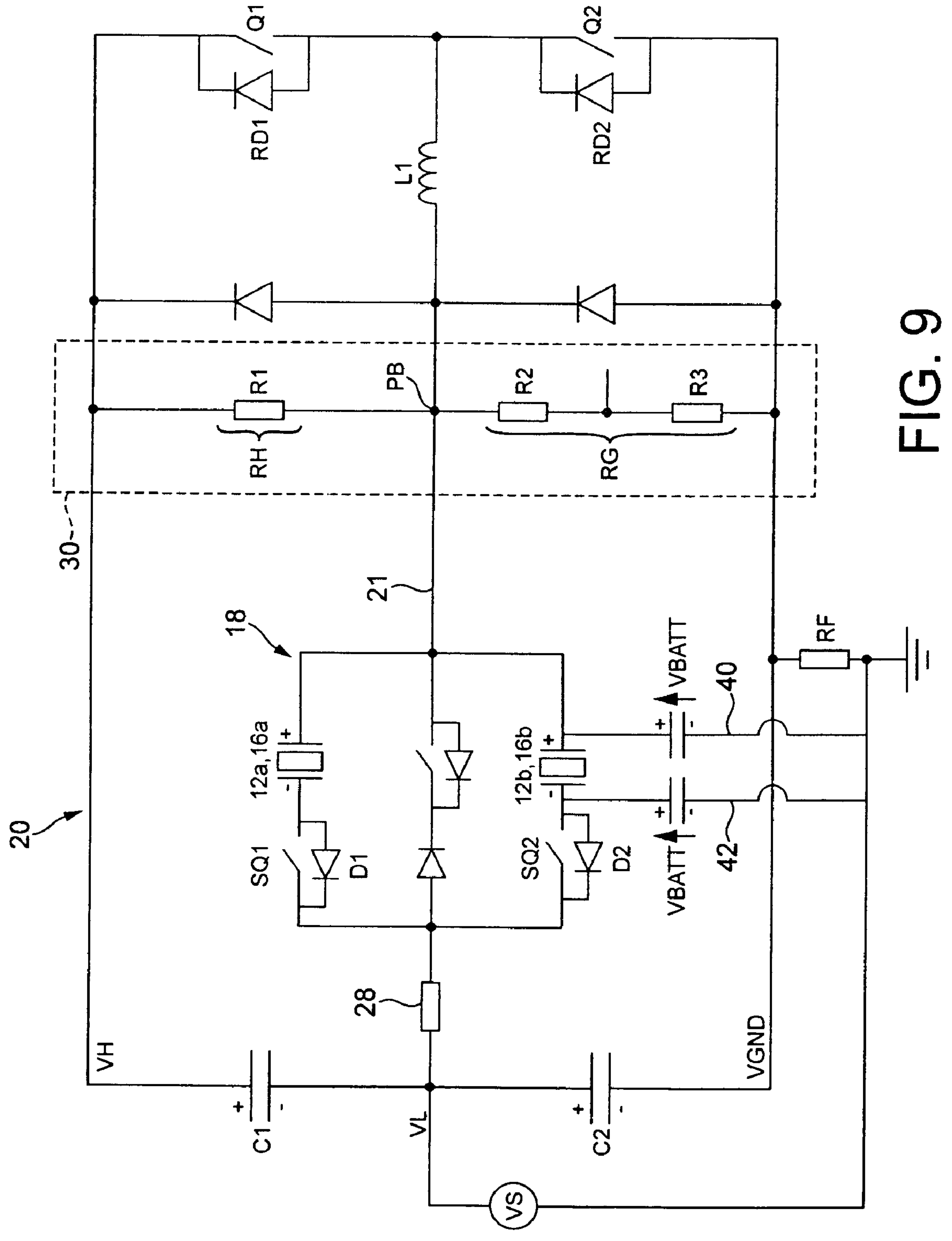
FIG. 9 is a drive circuit in which a high side to battery, and a low side to battery short circuit are shown.

It should be appreciated that the diagnostic methods described above for detecting high side to ground short circuits can also detect high side to ground short circuits via the vehicle battery voltage, also referred to as ‘high side to battery’ short circuits. Further, the diagnostic methods described above for detecting low side to ground short circuits can also detect low side to ground short circuits via the battery voltage, also referred to as ‘low side to battery’ short circuits. FIG. 9 shows an example of a high side to battery short circuit 40, and a low side to battery short circuit 42. Short circuits via the battery such as those shown in FIG. 9 are of low impedance.

Further, it will be appreciated that the various methods and diagnostic routines described herein can be combined in any combination in order to test for the various different types of short circuit at engine start-up, that is stack terminal, injector low side to ground, injector high side to ground, injector low side to battery and injector high side to battery short circuits.

The invention claimed is:

1. A fault detection method for detecting faults in an injector arrangement at engine start-up, the injector arrangement comprising at least one piezoelectric fuel injector, and the method comprising:

charging the injector during a charge phase;

allowing a delay period to elapse following the charge phase;

providing a discharge current path during the delay period through which the injector can discharge if there is an injector low side to ground short circuit;

attempting to recharge the injector during a recharge phase following the delay period;

sensing a current through the injector during the recharge phase; and generating a first fault signal if the sensed current exceeds a first predetermined threshold current.

2. The method of claim 1, wherein the first fault signal is either indicative of a short circuit between the terminals of the injector, or indicative of an injector low side to ground short circuit.

3. The method of claim 1, wherein the step of providing a discharge current path includes connecting the injector arrangement to a discharge circuit.

4. The method of claim 3, wherein the step of connecting the injector arrangement to a discharge circuit includes closing a discharge switch associated with the discharge circuit.

5. The method of claim 3, wherein said injector has an associated selector switch for individually selecting said injector into the discharge circuit to discharge the selected injector, wherein the steps in claim 1 are performed with said selector switch open such that said injector is deselected from the discharge circuit.

6. The method of claim 1, further comprising, if a first fault signal is generated:

(g) charging the injector during a further charge phase;

(h) allowing a further delay period to elapse without forming the discharge current path;

(i) attempting to recharge the injector during a further recharge phase;

(j) sensing the current through the injector during the further recharge phase; and (k) generating a second fault signal indicative of a short circuit between the terminals of the injector if the current sensed exceeds a second predetermined threshold current.

7. The method of claim 6, further comprising (l) generating a third fault signal indicative of an injector low side to ground short circuit if the current sensed during the further recharge phase does not exceed the second predetermined threshold current.

8. The method of claim 1, further comprising:

sensing a discharge current in the discharge current path during the delay period; and generating a fourth fault signal indicative of an injector low side to ground short circuit if a discharge current exceeding a third predetermined threshold current is sensed in the discharge current path during the delay period.

9. The method of claim 8, further comprising monitoring the current in a plurality of current paths during the delay period and recording the location of the low side to ground short circuit in a memory device in response to the fourth fault signal.

10. The method of claim 8, wherein the first fault signal is indicative of a short circuit between the piezoelectric stack terminals of the injector if a discharge current exceeding the third predetermined threshold current is not sensed in the discharge current path during the delay period.

11. The method of claim 1, wherein the step of charging the injector includes connecting the injector arrangement to a charge circuit.

12. The method of claim 11, wherein the step of connecting the injector arrangement to the charge circuit includes closing a charge switch associated with the charge circuit.

13. A non-transitory computer readable medium containing computer instructions stored therein for causing a computer processor to perform the method of claim 1.

14. A microcomputer provided with the computer readable medium of claim 13.

* * * * *